(12) United States Patent
Mulders

(10) Patent No.: US 7,102,400 B1
(45) Date of Patent: Sep. 5, 2006

(54) PHASE LOCKED LOOP CHARGE PUMP AND METHOD OF OPERATION

(75) Inventor: Adrianus G. Mulders, 's-Hertogenbosch (NL)

(73) Assignee: SiTel Semiconductor B.V., (NL)

( * ) Notice: Subject to any disclaimer, the term of this patent is extended or adjusted under 35 U.S.C. 154(b) by 0 days.

(21) Appl. No.: 10/929,158

(22) Filed: Aug. 30, 2004

(51) Int. Cl.
*H03L 7/06* (2006.01)
(52) U.S. Cl. .................... 327/157; 327/148
(58) Field of Classification Search ........... 327/148, 327/149, 157; 375/373, 374, 375, 376; 331/17, 331/25
See application file for complete search history.

(56) References Cited

U.S. PATENT DOCUMENTS

| | | | |
|---|---|---|---|
| 6,512,404 B1 | 1/2003 | Ruegg et al. | 327/157 |
| 6,759,912 B1 * | 7/2004 | Yamagishi et al. | 331/17 |
| 2004/0183598 A1 * | 9/2004 | Behzad | 330/253 |
| 2005/0162200 A1 * | 7/2005 | Haerle | 327/157 |

OTHER PUBLICATIONS

Woogeun Rhee, "Design of High-Performance CMOS Charge Pumps In Phase-Locked Loops", IEEE, 1999, pp. II-545-II-548.
Esdras Juarez-Hernandez et al., "A Novel CMOS Charge-Pump Circuit with Positive Feedback for PLL Applications", Instituto Tecnologico de Chihuahua, Electro 2001, pp. 283-286.
Jae-Shin Lee et al., "A Charge Pump with Perfect Current Matching Characteristics in Phase-Locked Loops."
Juha Hakkinen et al., "An Integrated Programmable Low-Noise Charge Pump", IEEE, 1999, pp. 185-188.

* cited by examiner

*Primary Examiner*—Linh My Nguyen

(57) ABSTRACT

A charge pump includes a current source capable of generating a reference current. The charge pump also includes a first current mirror capable of conducting a first current. The charge pump further includes a second current mirror capable of conducting a second current and the reference current. In addition, the charge pump includes an output coupled to the first and second current mirrors and capable of providing one of the first and second currents as an output of the charge pump. The first current mirror may be capable of conducting the first current and a second reference current. The second current mirror may be capable of conducting the second current, the reference current, and the second reference current.

23 Claims, 4 Drawing Sheets

US 7,102,400 B1

PHASE LOCKED LOOP CHARGE PUMP AND METHOD OF OPERATION

TECHNICAL FIELD

This disclosure is generally directed to phase locked loops and more specifically to a phase locked loop charge pump and method of operation.

BACKGROUND

Phase locked loops are used in a wide variety of applications. For example, phase locked loops are routinely used in communication devices to provide clock signals to various components of the devices. A conventional phase locked loop includes a charge pump that controls a reference voltage used by an oscillator to produce an output signal. Conventional charge pumps typically generate "up" and "down" currents to control the reference voltage.

A problem with conventional phase locked loops is that the output signals suffer from unwanted spurious signals. These spurious signals can negatively affect the components that use the output signals. For example, communication devices often use phase locked loops to transmit and receive data. Unwanted spurious signals may disturb data being received and introduce unwanted spectral content into data being transmitted.

The charge pumps are often the dominant component that determines the level of unwanted spurious signals in the output signals generated by the phase locked loops. A common cause is a mismatch between the "up" and "down" currents generated by the charge pumps.

BRIEF DESCRIPTION OF THE DRAWINGS

For a more complete understanding of this disclosure and its features, reference is now made to the following description taken in conjunction with the accompanying drawings, in which.

DETAILED DESCRIPTION

Figure 1:
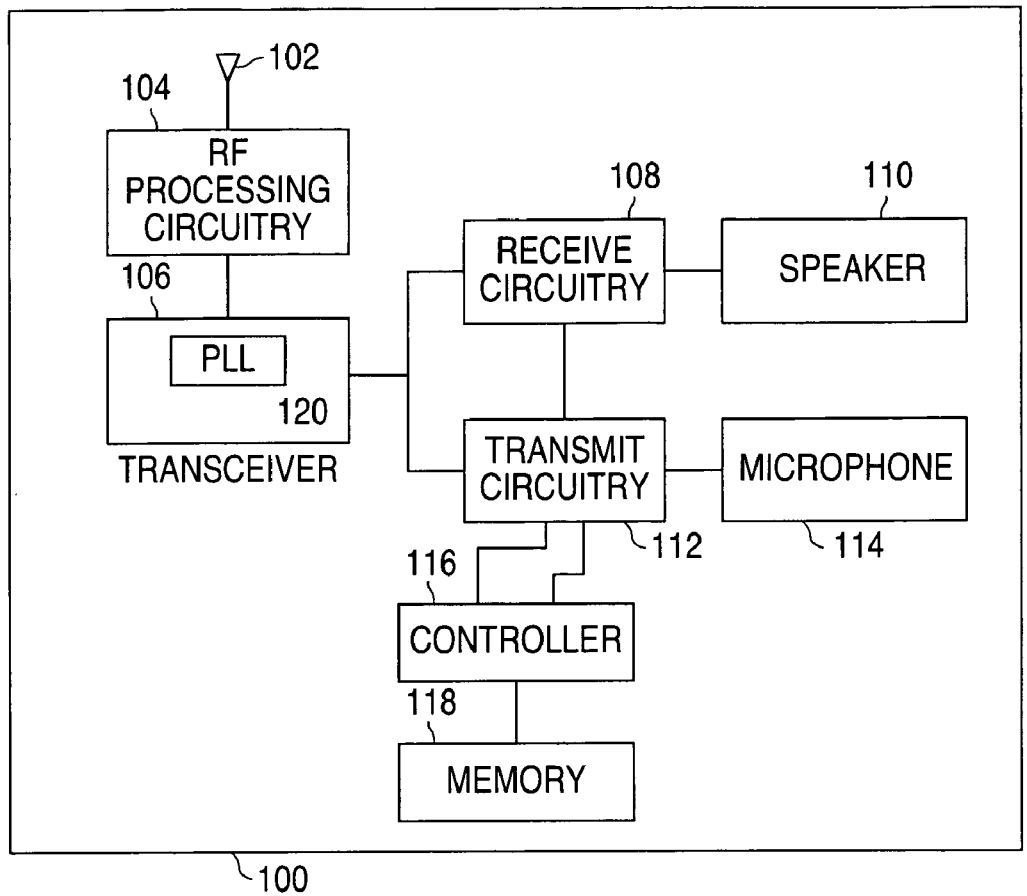
FIG. 1 illustrates an example wireless device according to one embodiment of this disclosure.

FIG. 1 illustrates an example wireless device 100 according to one embodiment of this disclosure. The wireless device 100 illustrated in FIG. 1 is for illustration only. Other devices could be used without departing from the scope of this disclosure. Also, the wireless device 100 in FIG. 1 has been simplified for ease of illustration and explanation. Other or additional components could be included in the wireless device 100.

In the illustrated embodiment, the wireless device 100 includes an antenna 102. The antenna 102 facilitates the communication of information over a wireless interface. The antenna 102 may represent any suitable structure that is capable of facilitating the transmission or reception of wireless signals. As a particular example, the antenna 102 may support the transmission and reception of radio frequency signals.

Radio frequency (RF) processing circuitry 104 is coupled to the antenna 102. In this document, the term "couple" and its derivatives refer to any direct or indirect communication between two or more components, whether or not those components are in physical contact with one another. The RF processing circuitry 104 processes the signals transmitted or received by the antenna 102. As particular examples, the RF processing circuitry 104 could include one or more low-noise amplifiers, mixers, filters, and power amplifiers.

A transceiver 106 is coupled to the RF processing circuitry 104. The transceiver 106 may receive incoming signals received by the antenna 102 and down-convert the signals to generate baseband or intermediate frequency signals. The transceiver 106 may also receive baseband signals or intermediate frequency signals and up-convert the signals for transmission by the antenna 102. The transceiver 106 could include any hardware, software, firmware, or combination thereof for facilitating communication using the antenna 102. As a particular example, the transceiver 106 could include a transmitter and a receiver.

Receive circuitry 108 is coupled to the transceiver 106. The receive circuitry 108 receives and processes incoming signals received by the wireless device 100. For example, the receive circuitry 108 may receive the baseband or intermediate frequency signals produced by the transceiver 106 and process the signals to extract information contained in the signals. The receive circuitry 108 may include any hardware, software, firmware, or combination thereof for processing incoming signals, such as a filter or decoder. In the illustrated example, the incoming signals represent voice information, and the extracted voice information may be provided to a speaker 110 for presentation to a user.

Transmit circuitry 112 is coupled to the transceiver 106. The transmit circuitry 112 receives and processes outgoing signals for transmission by the wireless device 100. For example, the transmit circuitry 112 may receive voice information and process the information to produce baseband or intermediate frequency signals. The baseband or intermediate frequency signals may then be provided to the transceiver 106. The transmit circuitry 112 may include any hardware, software, firmware, or combination thereof for processing outgoing signals, such as a filter or an encoder. In the illustrated example, the outgoing signals may include voice information collected by a microphone 114.

A controller 116 is connected to the receive circuitry 108 and the transmit circuitry 112. The controller 116 controls the operation and behavior of the wireless device 100. For example, the controller 116 could allow a user to mute the wireless device 100 so that no voice information is transmitted by the wireless device 100. In this example, the controller 116 may instruct the transmit circuitry 112 to stop transmitting information when the wireless device 100 is muted. The controller 116 could represent any suitable controller, such as a processor. The logic executed by the controller 116 could be stored in a memory 118, which may represent any suitable storage and retrieval device or devices. In other embodiments, the controller 116 and the memory 118 could be omitted from the wireless device 100.

Figure 2:
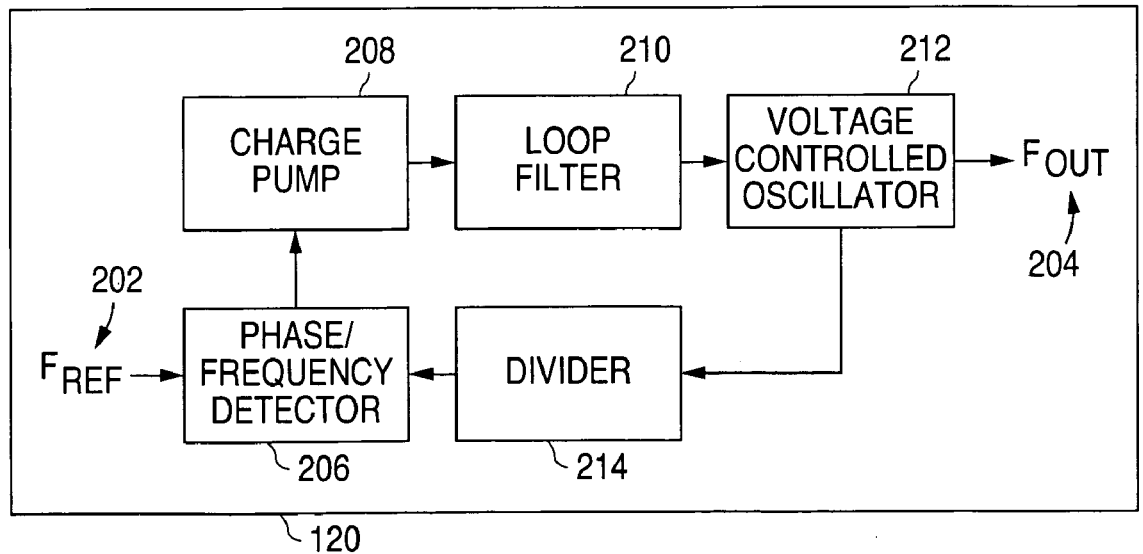
FIG. 2 illustrates an example phase locked loop according to one embodiment of this disclosure.

In one aspect of operation, the transceiver 106 includes a phase locked loop (PLL) 120. The phase locked loop 120 includes a charge pump, which generates "up" and "down" currents that control a reference voltage. The reference voltage controls the frequency of an output signal generated by an oscillator. One example embodiment of a phase locked loop 120 is shown in FIG. 2, which is described below.

The charge pump in the phase locked loop 120 is capable of producing highly accurate "up" and "down" currents over a large output voltage range. The charge pump may help to ensure more constant phase locked loop dynamics and may reduce the complexity of the phase locked loop 120. As explained below, the accuracy of the "up" and "down" currents may be realized by relating the currents to one another and by making the currents independent of the operating points of source transistors in the charge pump. Also, the "up" and "down" currents may be related to a reference current produced by a reference source in the charge pump, and the current from the reference source may be maintained as a constant.

In this way, the "up" and "down" currents produced by the charge pump in the phase locked loop 120 may more closely match each other. As a result, the charge pump suffers from a reduced amount (or no amount) of mismatch between the "up" and "down" currents over a larger output voltage range. This may help to reduce or eliminate the presence of unwanted spurious signals in the output of the phase locked loop 120 caused by a mismatch between the "up" and "down" currents.

Although FIG. 1 illustrates one example of a wireless device 100, various changes may be made to FIG. 1. For example, while FIG. 1 illustrates a wireless device 100 providing voice services, other one-way or multi-way wireless or wireline communication devices or other devices could use the phase locked loop 120. As a particular example, other interfaces may be used in place of the antenna 102, and one of the receive circuitry 108 and transmit circuitry 112 could be omitted. Also, various components could be combined or omitted or additional components can be added to the device 100 according to particular needs. In addition, the phase locked loop 120 may be used in any other circuit, device, or system.

FIG. 2 illustrates an example phase locked loop 120 according to one embodiment of this disclosure. The phase locked loop 120 illustrated in FIG. 2 may, for example, be used in the wireless device 100 of FIG. 1 or in any other suitable device. The phase locked loop 120 shown in FIG. 2 is for illustration only. Other embodiments of the phase locked loop 120 could be used without departing from the scope of this disclosure.

The phase locked loop 120 is capable of receiving an input reference signal ($F_{REF}$) 202 and producing an output signal ($F_{OUT}$) 204. In the illustrated example, the phase locked loop 120 includes a phase-frequency detector 206. The phase-frequency detector 206 identifies a phase difference between the reference signal 202 and a signal provided by a frequency divider 214. Based on whether the reference signal 202 leads or trails the output signal 204, the phase-frequency detector 206 outputs either an "up" or "down" signal. The phase-frequency detector 206 includes any hardware, software, firmware, or combination thereof for identifying a phase difference between two or more inputs.

Figure 3:
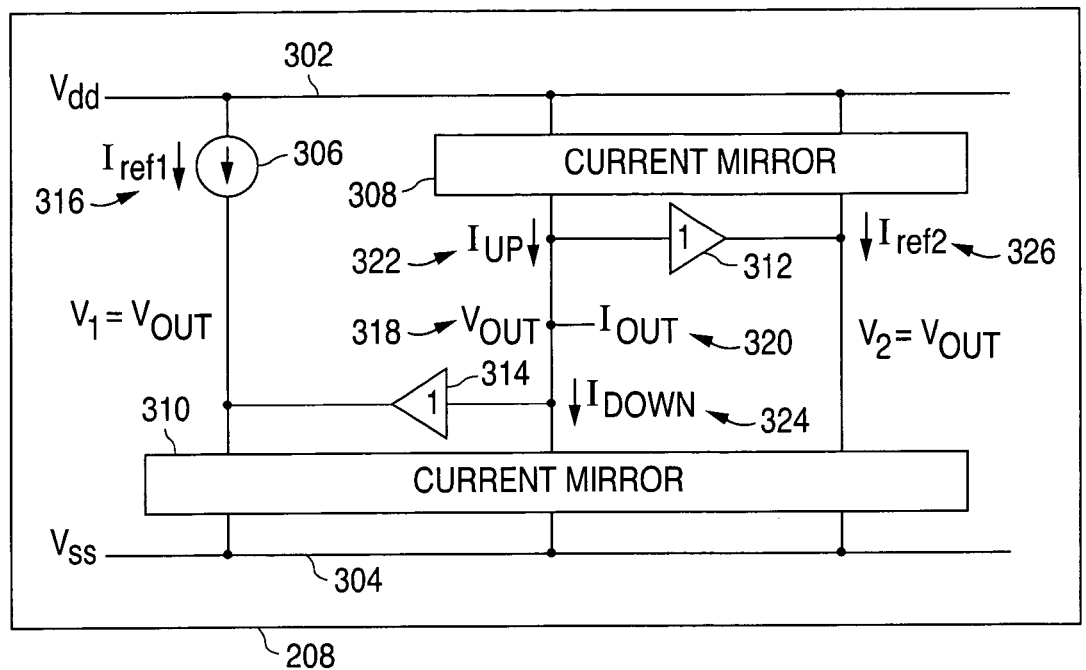
FIG. 3 illustrates an example charge pump according to one embodiment of this disclosure.

A charge pump 208 is coupled to the phase-frequency detector 206. The charge pump 208 receives the "up" and "down" signals from the phase-frequency detector 206. The charge pump 208 then sources or sinks a current to or from a loop filter 210, depending on whether the "up" or "down" signal is being received by the charge pump 208. In particular, the charge pump 208 sources an "up" current to the loop filter 210 when an "up" signal is received from the phase-frequency detector 206, which increases the voltage stored on the loop filter 210. The charge pump 208 sinks a "down" current from the loop filter 210 when a "down" signal is received from the phase-frequency detector 206, which decreases the voltage stored on the loop filter 210. In this way, the charge pump 208 controls the voltage stored on the loop filter 210. The charge pump 208 includes any structure capable of controlling a voltage stored on a loop filter 210. One example of a charge pump 208 is shown in FIG. 3, which is described below.

The loop filter 210 is coupled to the charge pump 208. The loop filter 210 is capable of storing a voltage that is controlled by the charge pump 208. The loop filter 210 represents any suitable filter, such as a low-pass filter or a band-pass filter.

A voltage controlled oscillator 212 is coupled to the loop filter 210. The oscillator 212 is capable of producing the output signal 204. For example, the frequency of the output signal 204 may be controlled by the voltage stored on the loop filter 210. The oscillator 212 includes any suitable oscillator capable of generating an output signal 204.

A frequency divider 214 is coupled to the oscillator 212 and to the phase-frequency detector 206. The divider 214 is capable of providing the phase-frequency detector 206 with an altered version of the output signal 204. For example, the divider 214 may reduce the frequency of the output signal 204 by a factor of n, where n represents any suitable value. The divider 214 then provides the altered output signal to the phase-frequency detector 206, which uses the altered output signal to generate an "up" or "down" signal for the charge pump 208. The divider 214 includes any hardware, software, firmware, or combination thereof for altering the frequency of a signal.

As described above, the charge pump 208 is capable of producing highly accurate "up" and "down" currents over a large output voltage range. In particular, the charge pump 208 generates "up" and "down" currents having a smaller or no mismatch. This may help to increase the accuracy of the charge pump 208 and may allow the phase locked loop 120 to generate an output signal 204 having fewer or no unwanted spurious signals. This may also allow the wireless device 100 or other device in which the phase locked loop 120 operates to more effectively use the output signal 204.

Although FIG. 2 illustrates one example of a phase locked loop 120, various changes may be made to FIG. 2. For example, the functional division shown in FIG. 2 is for illustration only. Various components could be combined, omitted, or further subdivided and additional components could be added according to particular needs.

FIG. 3 illustrates an example charge pump 208 according to one embodiment of this disclosure. The charge pump 208 illustrated in FIG. 3 may, for example, be used in the phase locked loop 120 of FIG. 2. The charge pump 208 shown in FIG. 3 is for illustration only. Other embodiments of the charge pump 208 may be used without departing from the scope of this disclosure.

In the illustrated example, the charge pump 208 includes two voltage rails 302–304. The voltage rails 302–304 provide operating voltage to the various components in the charge pump 208. The voltage rails 302–304 provide any suitable voltage differential in the charge pump 208. For example, the voltage rail 302 could supply a voltage of two volts, and the voltage rail 304 could provide a ground voltage.

The charge pump 208 also includes a current source 306, two current mirrors 308–310, and two unity gain amplifiers 312–314. The current source 306, current mirrors 308–310, and unity gain amplifiers 312–314 represent any suitable current source, current mirrors, and amplifiers, respectively. In particular embodiments, the current source 306 represents a constant current source. Also, each of the current mirrors 308–310 may include one or multiple transistors. In this example embodiment, the current source 306 generates a reference current ($I_{ref1}$) 316.

In one aspect of operation, the charge pump 208 produces an output voltage ($V_{OUT}$) 318 and an output current ($I_{OUT}$) 320. The output current 320 is sourced to or drained from the loop filter 210. This results in the output voltage 318. Depending on whether the charge pump 208 is sourcing or draining the current 320 to or from the loop filter 210, the output current 320 represents either an "up" current ($I_{UP}$) 322 or a "down" current ($I_{DOWN}$) 324.

In this example, the current mirror 308 conduct two currents (the "up" current 322 and a reference current ($I_{ref2}$) 326) that approximate or mirror one another. Similarly, the current mirror 310 conduct three currents (the reference current 316, the "down" current 324, and the reference current 326) that approximate or mirror one another.

When the output voltage 318 is present along all three vertical paths of the charge pump 208, transistors in the current mirror 308 have identical or approximately identical operating points. Also, transistors in the current mirror 310 have identical or approximately identical operating points. As a result, the current mirrors 308–310 conduct accurately matched currents. Because of this, the "up" and "down" currents 322–324 are more accurately matched.

Although FIG. 3 illustrates one example of a charge pump 208, various changes may be made to FIG. 3. For example, other or additional components could be used in the charge pump 208. Also, the charge pump 208 may be used in any suitable environment. As a particular example, the charge pump 208 may be used in a low supply voltage closed-loop phase locked loop or other phase locked loop.

Figure 4:
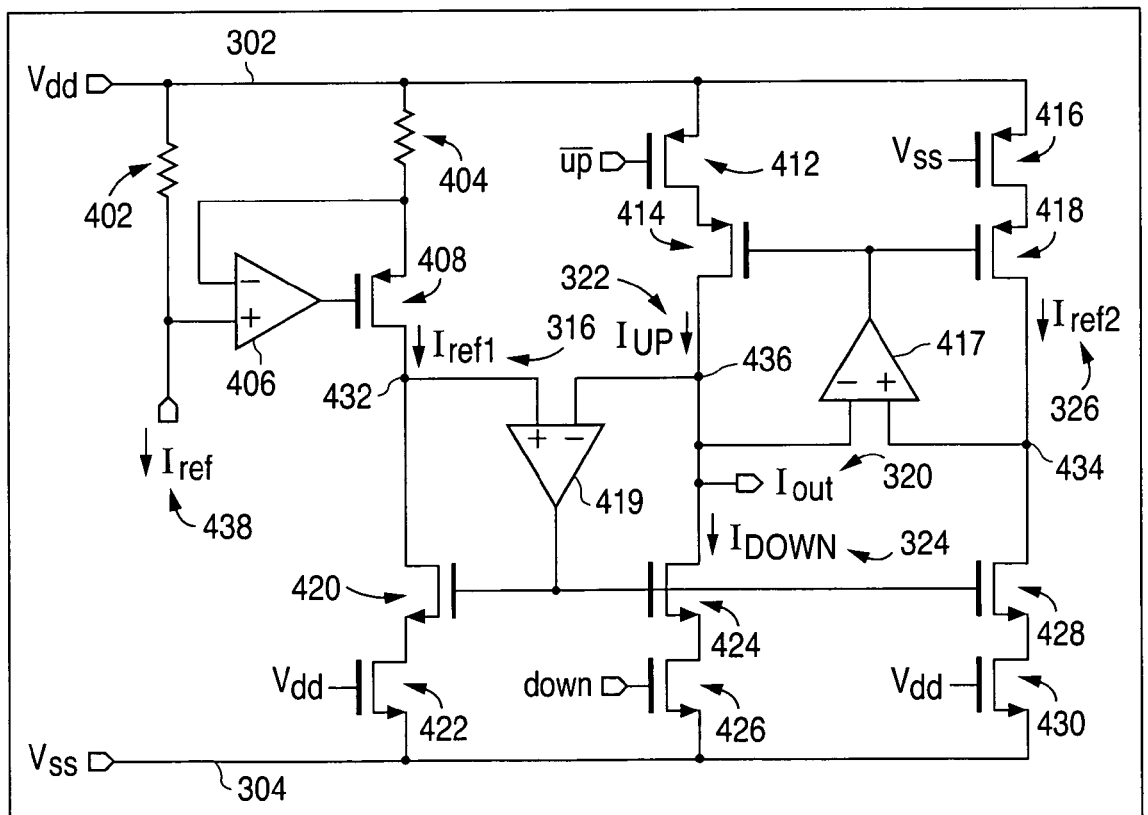
FIG. 4 illustrates additional details of an example charge pump according to one embodiment of this disclosure.

FIG. 4 illustrates additional details of an example charge pump 208 according to one embodiment of this disclosure. The charge pump 208 illustrated in FIG. 4 may, for example, operate according to the functional concepts shown in FIG. 3. The implementation of the charge pump 208 shown in FIG. 4 is for illustration only. Other embodiments of the charge pump 208 may be used without departing from the scope of this disclosure.

As shown in FIG. 4, the current source 306 of FIG. 3 is implemented using two resistors 402–404, an op-amp 406, and a transistor 408. The resistors 402–404 may have any suitable resistances. As a particular example, the resistor 402 may have a resistance of 3000Ω, and the resistor 404 may have a resistance of 3000Ω. The op-amp 406 represents any suitable operational amplifier. In addition, the transistor 408 represents any suitable transistor, such as a Positive-channel Metal Oxide Semiconductor (PMOS) field effect transistor.

The first current mirror 308 of FIG. 3 is implemented using transistors 412–418, and the unity gain amplifier 312 is implemented using an operational amplifier (op-amp) 417 and also transistor 418. The transistors 412–418 may represent any suitable transistors, and the op-amp 417 may represent any suitable op-amp. In particular embodiments, the transistors 412–418 represent PMOS field effect transistors. The sources, gates, and drains of the transistors 412–418 may be connected as shown in FIG. 4.

The second current mirror 310 of FIG. 3 is implemented using transistors 420–430, and the unity gain amplifier 314 is implemented using an op-amp 419 and also transistor 420. The transistors 420–430 may represent any suitable transistors, and the op-amp 419 may represent any suitable op-amp. In particular embodiments, the transistors 420–430 represent Negative-channel Metal Oxide Semiconductor (NMOS) field effect transistors. The sources, gates, and drains of the transistors 420–430 may be connected as shown in FIG. 4.

In one aspect of operation, the charge pump 208 operates to keep the voltages at nodes 432–434 equal or approximately equal to the output voltage at node 436. The current mirrors 308–310 are applied to the "up" and "down" currents 322–324, which helps to ensure that the transistors 412–430 in the current mirrors 308–310 conduct equal or approximately equal drain currents.

In the illustrated example, the transistor 424 acts as a current source, and the transistor 426 acts as a switch that is controlled by the "down" signal produced by the phase-frequency detector 206. When the transistor 426 is conducting or closed, the current source transistor 424 sinks a current from the loop filter 210. The op-amp 419 replicates the loop filter voltage to the node 432. This helps to ensure that the "down" current 324 through the current source transistor 424 equals a multiple of the reference current 316 through the transistor 420 because the operating points of the transistors 420, 424 are the same.

Similarly, the transistor 414 acts as a current source, and the transistor 412 acts as a switch that is controlled by an inverted "up" signal produced by the phase-frequency detector 206. When the transistor 412 is closed, the current source transistor 414 sources a current into the loop filter 210. The op-amp 417 replicates the loop filter voltage to the node 434. This helps to ensure that the "up" current 322 through the transistor 414 equals a multiple of the reference current 326 through the transistor 418 because the operating points of the transistors 414, 418 are the same.

In this way, the current mirrors 308–310 operate and accurately mirror the currents over a large output voltage range. In addition, to help keep the currents constant over the output voltage range, a constant reference current 316 is used. The constant reference current 316 is realized by the constant current source 306 that includes op-amp 406. A reference current (Iref) 438 is converted to a voltage by the resistor 402, and the voltage is duplicated over the resistor 404 by the op-amp 406 and the transistor 408. In this way, a scaled version of the reference current 438 is generated, which is determined by the ratio of the resistors 402–404. If the ratio of the resistors 402–404 equals one, the reference current 438 may not be scaled.

In this example, the transistors 416, 422, and 430 act as dummy switches that are always conducting or closed. These transistors 416, 422, and 430 help to ensure proper matching between the current sources. Also, to be able to follow the entire loop voltage range, the op-amps 417, 419 may include rail-to-rail input capability.

Although FIG. 4 illustrates one example of a charge pump 208, various changes may be made to FIG. 4. For example, the implementations of the current source 306 and the current mirrors 308–310 are for illustration only. Other embodiments of the current source 306, current mirror 308, and/or current mirror 310 may be used.

Figure 5A:
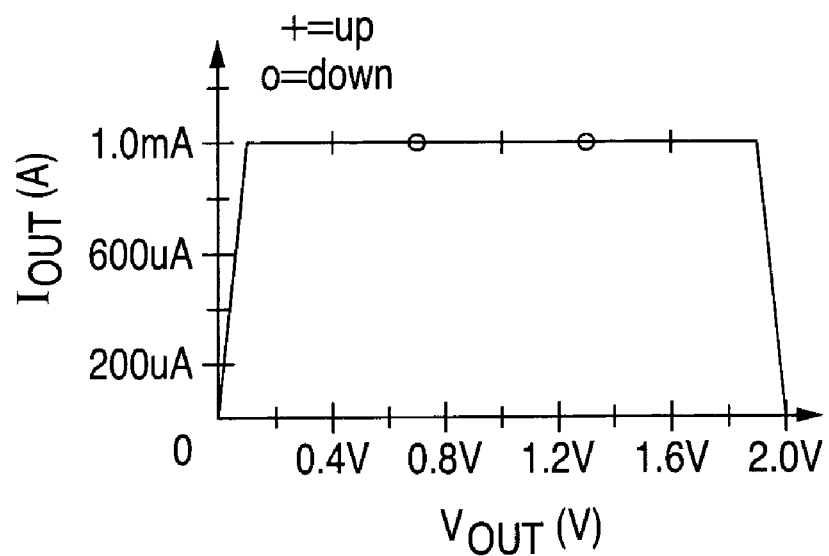
FIGS. 5A through 5C illustrate example behaviors of a charge pump according to one embodiment of this disclosure.
Figure 5B:
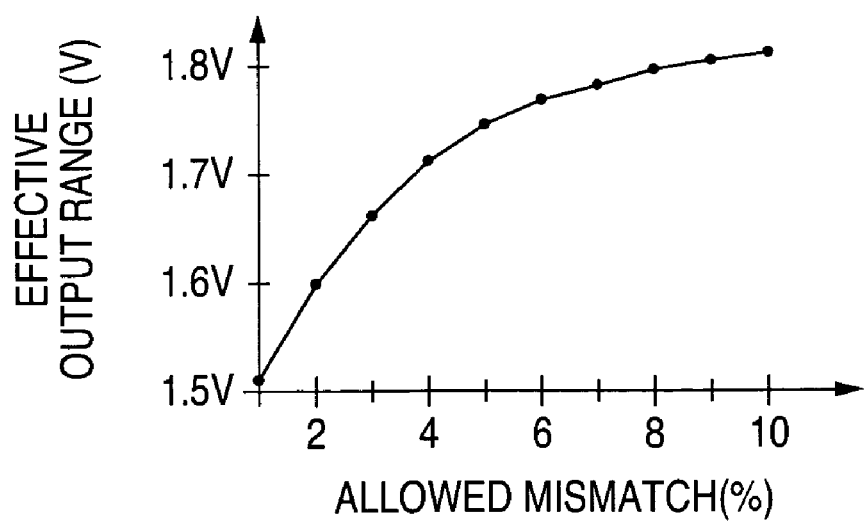
Figure 5C:
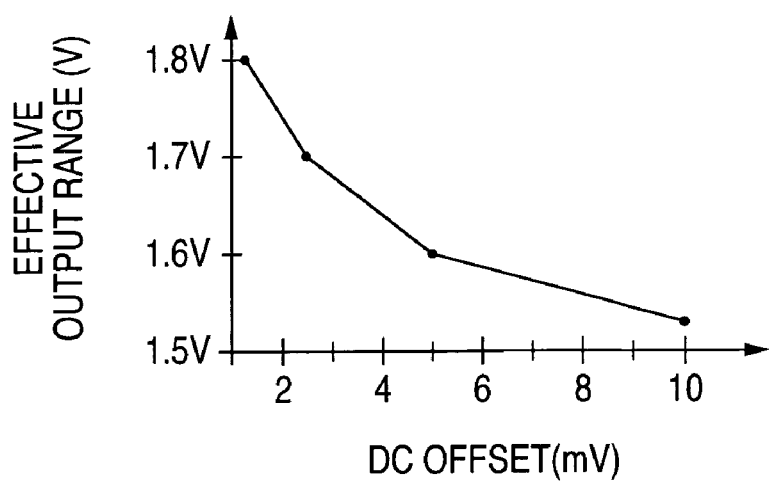

FIGS. 5A through 5C illustrate example behaviors of a charge pump 208 according to one embodiment of this disclosure. The behavior of the charge pump 208 illustrated in FIGS. 5A through 5C is for illustration only. Other embodiments of the charge pump 208 that have other behaviors could be used without departing from the scope of this disclosure.

In FIG. 5A, the "up" and "down" currents 322–324 are shown as a function of the output voltage 318. As shown in FIG. 5A, the variation of the "up" and "down" currents 322–324 over the range of the output voltage 318 is negligible. Similarly, the mismatch between the "up" and "down" currents 322–324 are negligible.

The offset voltage of op-amp 406 causes a constant current error for both the "up" and "down" currents 322–324, which may be identical for both. For the implementation of the charge pump 208 shown in FIG. 4, the voltage drop over the resistor 402 may be 100 mV. A 10 mV offset voltage thus causes a ten percent current error, which may be identical for both the "up" and "down" currents 322–324. As a result, this may not compromise the matching of the "up" and "down" currents 322–324. The error may also be constant over the output voltage range, so the dynamics of the phase locked loop 120 may also be constant. This means that the matching of the "up" and "down" currents 322–324 is generally insensitive to the DC offset of the op-amp 406. If more accurate currents are required, only the DC offset of the op-amp 406 may have to be reduced. The DC offset in relation to the voltage drop over the resistor 404 determines the error.

Also, the offset voltages of op-amps 417, 419 may have a negligible effect on the current error. The ratio between any two of the active mirror currents, assuming the current mirrors 308–310 are in the saturation region, can be calculated as:

$$\frac{I_2}{I_1} = \frac{K_2}{K_1} \frac{1 + \lambda V_{DS2}}{1 + \lambda V_{DS1}}, \qquad (1)$$

where, for example, $I_1$ represents the current through the transistor 418, $I_2$ represents the current through the transistor 414, $K_2/K_1$ represents the size (width over length ratio) between the transistors 418 and 414, $V_{DS1}$ represents the drain-source voltage of the transistor 418, $V_{DS2}$ represents the drain-source voltage of the transistor 414, and $\lambda$ is the channel-length modulation factor. The same equation could be used with transistors 420 and 424 or with transistors 420 and 428.

If the offset of op-amp 417 and/or op-amp 419 is 10 mV, the voltage at the node 434 and/or node 432 deviates 10 mV from the output voltage at node 436. The channel-length modulation factor of the output current sources is approximately 50 µS. A 10 mV voltage difference may cause a 0.5 µA error current, which is 0.05 percent of the 1 mA output current 320. The maximum mismatch between the "up" and "down" currents 322–324 in this case is 0.1 percent.

However, op-amp DC offset may reduce the effective output voltage range of the charge pump 208. This may be caused by the fact that the current mirrors 308–310 at a certain point may go out of saturation. Therefore, their mismatch may no longer be determined by the channel-length modulation factor but by the triode region characteristics of the current mirrors 308–310.

Assume an active current mirror having two MOS Transistor ("MOST") devices with drain-source voltages of:

$$V_{DS2} = V_{DS1} + V_{OS} = V_{DS} + V_{OS} \qquad (2)$$

where $V_{DS}$ represents the drain-source voltage of both transistors when no DC offset would be present and $V_{OS}$ represents the equivalent input DC offset of the op-amps 417, 419. When both devices are in the triode region, the current mirror ratio can be calculated as:

$$\frac{I_2}{I_1} = \frac{K_2}{K_1}\left[1 + \frac{(V_{GS} - V_{TH} - V_{DS})V_{OS} - \frac{V_{OS}^2}{2}}{(V_{GS} - V_{TH})V_{DS} - \frac{V_{DS}^2}{2}}\right] \qquad (3)$$

where $V_{GS}$ represents the gate-source voltage of both transistors and $V_{TH}$ represents the threshold voltage of both transistors. If a certain mismatch between the "up" and "down" currents 322–324 is allowed, the effective output voltage range as a function of the acceptable current mismatch may be depicted as shown in FIG. 5B, for an offset of 10 mV for each of the op-amps 417, 419.

For a 10 mV DC offset for op-amps 417, 419 and an allowed current mismatch of one percent, the effective output voltage range may be about 1.5V. Reducing DC offset may yield a greater output range as illustrated in FIG. 5C, depicted for an allowed current mismatch of one percent. In particular embodiments, reducing DC offset may yield a greater output range of approximately 100 mV each time the DC offset is cut in half. This may require a larger device, such as a four-times larger device.

In addition to the DC offset of the op-amps 417, 419, DC offsets due to mismatch of the MOST devices is present. This may be in the same order of magnitude as any other known charge pump implementation. As a result, no additional disadvantages may be present in the charge pump 208. These DC offsets can be reduced considerably by increasing the size of the charge pump 208, resulting is op-amp dominant DC offset.

Although FIGS. 5A through 5C illustrate example behaviors of a charge pump 208, various changes may be made to FIGS. 5A through 5C. For example, the charge pump 208 shown in FIG. 4 may have any other suitable behaviors, and other charge pumps may have similar behaviors.

Figure 6:
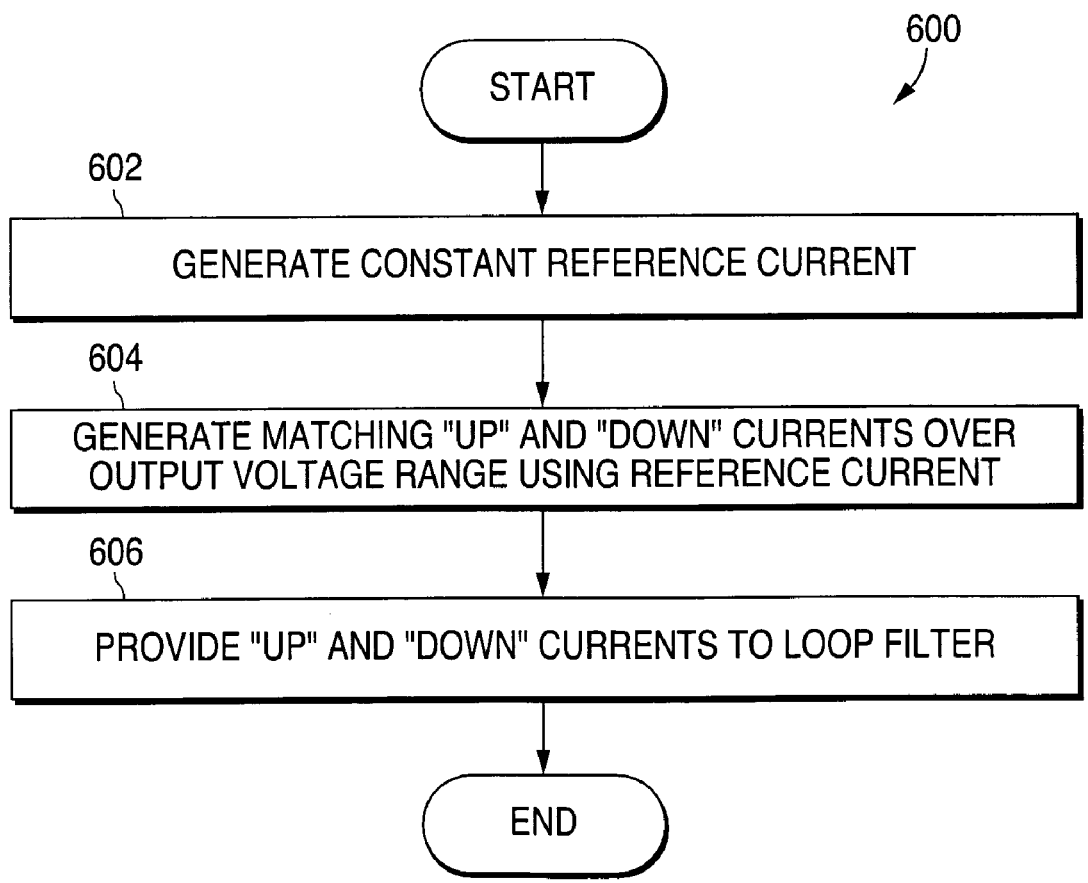
FIG. 6 illustrates an example method for operating a charge pump according to one embodiment of this disclosure.

FIG. 6 illustrates an example method 600 for operating a charge pump according to one embodiment of this disclosure. For ease of illustration and explanation, the method 600 is described with respect to the charge pump 208 shown in FIG. 3. The method 300 could be used by any other suitable charge pump.

The charge pump 208 generates a reference current at step 602. This may include, for example, the current source 306 in the charge pump 208 generating a constant reference current 316.

The charge pump 208 generates "up" and "down" currents using the reference current 316 at step 604. This may include, for example, the current mirror 308 ensuring that an "up" current 322 and a second reference current 326 are mirrored. This may also include the current mirror 310 ensuring that a "down" current 324, the reference current 316, and the second reference current 326 are mirrored. During this process, transistors in the current mirrors 308–310 may have identical or approximately identical operating points. In addition, this may include generating "up" and "down" currents 322–324 that substantially match each other over the entire range of output voltages 316.

The charge pump 208 provides the "up" and "down" currents to a loop filter at step 606. This may include, for example, the charge pump 208 sourcing the "up" current 322 or sinking the "down" current 324 to or from the loop filter 210. In this way, the charge pump 208 controls the voltage stored on the loop filter 210, where the voltage is used to control the frequency of the output signal 204 produced by the oscillator 212.

Although FIG. 6 illustrates one example of a method 600 for operating a charge pump, various changes may be made to FIG. 6. For example, although shown as a serial sequence of steps, the method 600 could represent an iterative process where "up" and "down" currents 322–324 are repeatedly generated and provided to the loop filter 210.

It may be advantageous to set forth definitions of certain words and phrases that have been used within this patent document. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, software, firmware, or combination thereof. It should be noted that the functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A charge pump, comprising:
a current source for generating a reference current, the current source comprising an operational amplifier coupled to a transistor;
a first current mirror for conducting a first current;
a second current mirror for conducting a second current and the reference current; and
an output coupled to the first and second current mirrors for providing one of the first and second currents as an output of the charge pump.

2. The charge pump of claim 1, wherein:
the first current mirror is for conducting the first current and a second reference current; and
the second current mirror is for conducting the second current, the reference current, and the second reference current.

3. The charge pump of claim 1, wherein the first and second currents are substantially equal over an entire output voltage range of the charge pump.

4. The charge pump of claim 1, wherein a mismatch between the first and second currents does not exceed 0.1 percent.

5. The charge pump of claim 1, wherein the reference current comprises a constant reference current.

6. The charge pump of claim 1, wherein the current source further comprises:
a first resistor coupled to a first input of the operational amplifier; and
a second resistor coupled to the first resistor and a second input of the operational amplifier;
wherein the transistor has a source coupled to the second resistor and the second input, a gate coupled to an output of the operational amplifier, and a drain for providing the reference current.

7. The charge pump of claim 1, further comprising:
a second operational amplifier coupled between the reference current and the first and second currents; and
a third operational amplifier coupled between the first and second currents and a second reference current conducted by the first current mirror.

8. The charge pump of claim 7, wherein the first current mirror and the third operational amplifier comprise:
a second transistor having a first source, a first gate, and a first drain;
a third transistor having a second source, a second gate, and a second drain;
a fourth transistor having a third source, a third gate, and a third drain; and
a fifth transistor having a fourth source, a fourth gate, and a fourth drain;
wherein the first and third sources are coupled to a first voltage rail, the first drain is coupled to the second source, the third drain is coupled to the fourth source, the first gate is coupled to an input signal, the third gate is coupled to a second voltage rail, the second and fourth gates are coupled to the third operational amplifier, the second drain is for providing the first current, and the fourth drain is for receiving the second reference current.

9. The charge pump of claim 8, wherein the second current mirror and the second operational amplifier comprise:
a sixth transistor having a fifth drain, a fifth gate, and a fifth source;
a seventh transistor having a sixth drain, a sixth gate, and a sixth source;
an eighth transistor having a seventh drain, a seventh gate, and a seventh source;
a ninth transistor having an eighth drain, an eighth gate, and an eighth source;
a tenth transistor having a ninth drain, a ninth gate, and a ninth source; and
an eleventh transistor having a tenth drain, a tenth gate, and a tenth source;
wherein the fifth drain is for receiving the reference current, the seventh drain is for providing the second current, the ninth drain is for providing the second reference current, the fifth and seventh and ninth gates are coupled to the second operational amplifier, the fifth source is coupled to the sixth drain, the seventh source is coupled to the eighth drain, the ninth source is coupled to the tenth drain, the sixth and tenth gates are coupled to the first voltage rail, the eighth gate is coupled to a second input signal, and the sixth and eighth and tenth sources are coupled to the second voltage rail.

10. A phase locked loop, comprising:
a loop filter for storing a voltage;
an oscillator for generating an output signal having a frequency based on the loop filter voltage;
a frequency divider for receiving the output signal and generating an altered output signal;
a phase-frequency detector for receiving an input signal and the altered output signal, comparing the input signal and the altered output signal, and generating control signals based on the comparison; and a charge pump for receiving the control signals and sourcing a first current to the loop filter and draining a second current from the loop filter based on the control signals, wherein the charge pump comprises:
a current source for generating a reference current the current source comprising an operational amplifier coupled to a transistor;
a first current mirror for conducting the first current; and
a second current mirror for conducting the second current and the reference current.

11. The phase locked loop of claim 10, wherein:
the first current mirror is for conducting the first current and a second reference current; and
the second current mirror is for conducting the second current, the reference current, and the second reference current.

12. The phase locked loop of claim 10, wherein the first and second currents are substantially equal over an entire output voltage range of the charge pump.

13. The phase locked loop of claim 10, wherein the current source comprises:
a first resistor coupled to a first input of the operational amplifier; and
a second resistor coupled to the first resistor and a second input of the operational amplifier;
wherein the transistor has a source coupled to the second resistor and the second input, a gate coupled to an output of the operational amplifier, and a drain for providing the reference current.

14. The phase locked loop of claim 10, wherein the charge pump further comprises:
a second operational amplifier coupled between the reference current and the first and second currents; and
a third operational amplifier coupled between the first and second currents and a second reference current conducted by the first current mirror.

15. The phase locked loop of claim 14, wherein the first current mirror and the third operational amplifier comprise:
a second transistor having a first source, a first gate, and a first drain;
a third transistor having a second source, a second gate, and a second drain;
a fourth transistor having a third source, a third gate, and a third drain; and
a fifth transistor having a fourth source, a fourth gate, and a fourth drain;
wherein the first and third sources are coupled to a first voltage rail, the first drain is coupled to the second source, the third drain is coupled to the fourth source, the first gate is coupled to an input signal, the third gate is coupled to a second voltage rail, the second and fourth gates are coupled to the third operational amplifier, the second drain is for providing the first current, and the fourth drain is for receiving the second reference current.

16. The phase locked loop of claim 15, wherein the second current mirror and the second operational amplifier comprise:
a sixth transistor having a fifth drain, a fifth gate, and a fifth source;
a seventh transistor having a sixth drain, a sixth gate, and a sixth source;
an eighth transistor having a seventh drain, a seventh gate, and a seventh source;
a ninth transistor having an eighth drain, an eighth gate, and an eighth source;
a tenth transistor having a ninth drain, a ninth gate, and a ninth source; and an eleventh transistor having a tenth drain, a tenth gate, and a tenth source;
wherein the fifth drain is for receiving the reference current, the seventh drain is for providing the second current, the ninth drain is for providing the second reference current, the fifth and seventh and ninth gates are coupled to the second operational amplifier, the fifth source is coupled to the sixth drain, the seventh source is coupled to the eighth drain, the ninth source is coupled to the tenth drain, the sixth and tenth gates are coupled to the first voltage rail, the eighth gate is coupled to a second input signal, and the sixth and eighth and tenth sources are coupled to the second voltage rail.

17. An apparatus, comprising:
an interface for at least one of: transmitting data and receiving data; and
a transceiver for at least one of: up-converting the data to be transmitted and down-converting the data received, the transceiver comprising a phase locked loop having a loop filter and a charge pump for sourcing a first current to the loop filter and draining a second current from the loop filter, the charge pump comprising:
a current source for generating a reference current, the current source comprising an operational amplifier coupled to a transistor;
a first current mirror for conducting the first current; and
a second current mirror for conducting the second current and the reference current.

18. The apparatus of claim 17, wherein:
the first current mirror is for conducting the first current and a second reference current; and
the second current mirror is for conducting the second current, the reference current, and the second reference current.

19. The apparatus of claim 17, wherein the first and second currents are substantially equal over an entire output voltage range of the charge pump.

20. The apparatus of claim 17, further comprising:
radio frequency processing circuitry coupled between the transceiver and an antenna; and
at least one of: transmit processing circuitry for generating the data to be transmitted and receive processing circuitry for processing the data received.

21. A method, comprising:
generating a reference current using a current source comprising an operational amplifier coupled to a transistor;
generating a first current and a second current in a charge pump using the reference current, the first and second currents substantially matching over an output voltage range of the charge pump, the substantial matching of the first and second currents being substantially insensitive to direct current offset of one or more operational amplifiers in the charge pump; and
sourcing the first current to a loop filter and sinking the second current from the loop filter to adjust a loop filter voltage.

22. The method of claim 21, wherein generating the first and second currents comprises:
mirroring the first current and a second reference current; and
mirroring the second current, the reference current, and the second reference current.

23. The method of claim 21, wherein a mismatch between the first and second currents does not exceed 0.1 percent.

* * * * *